(12) United States Patent
Gerber et al.

(10) Patent No.: US 6,879,028 B2
(45) Date of Patent: Apr. 12, 2005

(54) MULTI-DIE SEMICONDUCTOR PACKAGE

(75) Inventors: Mark A. Gerber, Austin, TX (US); Dae Y. Hong, Austin, TX (US); Sohrab Safai, Round Rock, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 10/371,089

(22) Filed: Feb. 21, 2003

(65) Prior Publication Data

US 2004/0164382 A1 Aug. 26, 2004

(51) Int. Cl.[7] .................. H01L 23/495; H01L 23/22; H01L 23/02; H01L 23/48; H01L 23/24; H01L 23/52; H01L 29/40

(52) U.S. Cl. ................. 257/676; 257/666; 257/686; 257/687; 257/692; 257/697; 257/784

(58) Field of Search .................. 257/666, 667, 257/676, 686, 687, 690, 692, 697, 723, 728, 762, 768, 772, 784

(56) References Cited

U.S. PATENT DOCUMENTS

| | | | |
|---|---|---|---|
| 5,147,815 A | | 9/1992 | Casto |
| 5,222,014 A | | 6/1993 | Lin |
| 5,473,514 A | * | 12/1995 | Nagano ................. 361/813 |
| 5,495,398 A | | 2/1996 | Takiar et al. |
| 5,545,922 A | * | 8/1996 | Golwalkar et al. ......... 257/676 |
| 5,637,913 A | * | 6/1997 | Kajihara et al. ............ 257/666 |
| 5,640,044 A | * | 6/1997 | Takehashi et al. .......... 257/666 |
| 5,646,829 A | * | 7/1997 | Sota .......................... 361/813 |
| 5,864,470 A | * | 1/1999 | Shim et al. ................. 361/777 |
| 6,104,084 A | * | 8/2000 | Ishio et al. ................. 257/666 |
| 6,225,688 B1 | | 5/2001 | Kim et al. |
| 6,329,224 B1 | | 12/2001 | Nguyen et al. |
| 6,340,839 B1 | * | 1/2002 | Hirasawa et al. ........... 257/672 |
| 6,376,914 B2 | | 4/2002 | Kovats et al. |
| 6,603,072 B1 | * | 8/2003 | Foster et al. ............... 174/52.4 |
| 6,713,852 B2 | * | 3/2004 | Abbott et al. ............... 257/677 |
| 6,737,736 B2 | * | 5/2004 | Abe et al. ................... 257/676 |
| 6,781,243 B1 | * | 8/2004 | Li et al. ..................... 257/777 |
| 2001/0013643 A1 | * | 8/2001 | Nakanishi et al. .......... 257/678 |

FOREIGN PATENT DOCUMENTS

| | | |
|---|---|---|
| EP | 0 680 086 B1 | 9/2001 |
| JP | 01220837 | 9/1989 |
| JP | 01272144 | 10/1989 |

* cited by examiner

*Primary Examiner*—Nathan J. Flynn
*Assistant Examiner*—Victor A. Mandala, Jr.
(74) *Attorney, Agent, or Firm*—David G. Dolezal; Daniel D. Hill

(57) ABSTRACT

A multi-die semiconductor package having an electrical interconnect frame. A top integrated circuit die is attached to the top side of an upper contact level of the frame and a bottom integrated circuit die is attached to the bottom side of the upper contact level of the frame. The die bond pads of the top die are electrically coupled (e.g. wired bonded) to pads of a lower contact level of the interconnect frame. The die bond pads of the bottom integrated circuit die are electrically coupled (e.g. wired bonded) to bond pads of the upper contact level of the frame. The bond pads of the lower contact level serve as external bond pads for the package. The frame may include inset structures, each having an upper portion located in the upper contact level and a lower portion located in the lower contact level.

23 Claims, 4 Drawing Sheets

MULTI-DIE SEMICONDUCTOR PACKAGE

BACKGROUND OF THE INVENTION

1. Field of the Invention

This invention relates in general to a semiconductor package and in particular to a multi-die semiconductor package.

2. Description of the Related Art

Multi-die semiconductor packages include multiple integrated circuit (IC) die. With some packages, the operation of one die in the package may interfere with the performance of the other die in a package. For example, in a package having a die with a digital integrated circuit including an embedded memory and having a die with a radio frequency RF integrated circuit, the embedded memory may generate hot spots within close proximity to the die with the RF integrated circuit. These hot spots may interfere with the performance of inductors of the RF integrated circuit, thereby reducing the overall performance of the RF integrated circuit.

What is needed is an improved configuration for a multi-die semiconductor package.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted.

DETAILED DESCRIPTION

The following sets forth a detailed description of a mode for carrying out the invention. The description is intended to be illustrative of the invention and should not be taken to be limiting.

Figure 1:
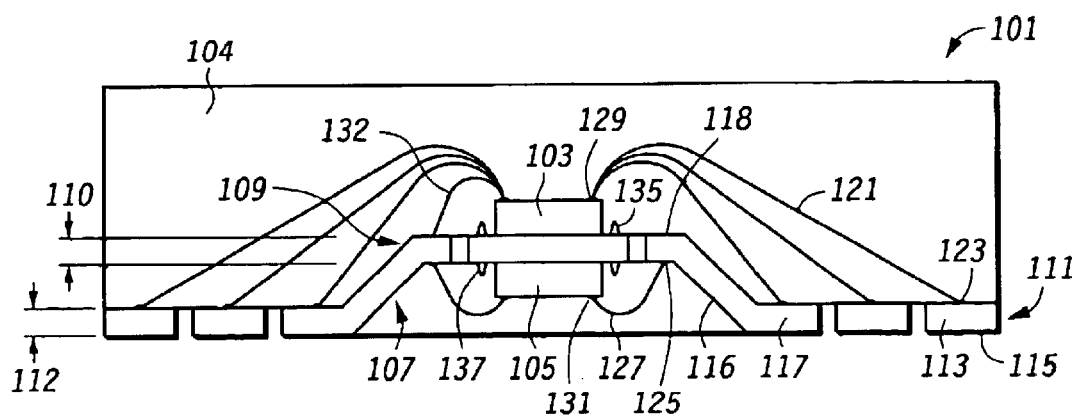
FIG. 1 is a partial side cutaway view of one embodiment of a multi-die semiconductor package according to the present invention.

FIG. 1 is a side cutaway view of a multi-die semiconductor package according to the present invention. Package 101 includes integrated circuit (IC) die 103 and IC die 105 encapsulated in a non electrically conductive encapsulation material 104. Package 101 includes an electrical interconnect frame 107 for providing electrical conductivity between the integrated circuits of die 103 and 105 and conductive structures external to package 101. In the embodiment shown, package 101 is a multi-die, partial array, no-lead package.

Frame 107 includes an upper contact level 109 and a lower contact level 111, with upper contact level 109 being parallel with lower contact level 111. In the embodiment of FIG. 1, upper contact level 109 is located generally in plane 110 and lower contact level 111 is located generally in plane 112. Frame 107 includes multiple electrically conductive structures, which in one embodiment are made of copper. In some embodiments, portions of frame 107 may be plated with a second metal such as, e.g., nickel, silver, gold, or palladium. Frame 107 includes multiple pads (e.g. 113) that make up portions of lower contact level 111. Each of these pads serves as a contact for coupling a signal or power pad of die 103 or 105 to an external conductive structure of a device (e.g. a printed circuit board (not shown)) to which package 101 is attached.

Die 103 is attached to the top surface of the upper contact level 109, and die 105 is attached to the bottom surface of upper contact level 109. Wires, e.g. 121, are bonded to wire bond pads (e.g. 129) located on the top surface of die 103 and bonded to a top surface 123 of a pad (e.g. 113) of the lower contact level 111 to electrically couple the die bond pads of die 103 to the pads of lower contact level 111.

Frame 107 includes inset structures (e.g. 116) with each inset structure including an upper portion (e.g. 118) located in upper contact level 109 and a lower portion (e.g. 117) located in lower contact level 111. Die 105 is attached to the bottom surface of upper contact level 109. The upper portions (e.g. 118) serve as bond pads for bonding wires (e.g. 127) that are bonded to die bond pads (e.g. 131) located on the bottom surface of die 105. The lower portions (e.g. 117) of the inset structures (e.g. 116) serve as package bond pads for coupling a signal or power die pad (e.g. 131) of die 105 to a conductive structure external to package 101. In the embodiment shown, some die bond pads of die 103 are coupled to upper portions (e.g. 118) of an insert structure via wires (e.g. 132).

In one embodiment, die 103 includes a digital IC such as, e.g., a base band processor or memory. Die 105 includes an RF IC such as e.g. a transmitter or receiver of a cellular phone. In other embodiments, die 105 may includes other types of analog ICs or may include a digital IC. Frame 107 provides an RF shielding between die 103 and 105.

Providing an electrical interconnect frame with upper and lower contact levels may allow, as shown in the embodiment of FIG. 1, for die to be placed on opposite sides of a frame (e.g. for shielding purposes) and still allow for portions of the frame to serve as external power and signal pads for both die. Furthermore, utilizing an upper and lower contact levels also may allow for a reduction in height of a multi-die package. Also, providing upper and lower contact levels may help to reduce the cross-coupling between the wires of the package in that wires coupled to the top die and wires coupled to the bottom die are less likely to run in parallel and in close proximately with each other.

Package 101 includes an adhesive bleed control ring 135 on the top surface of upper contact level 109 for containing the adhesive used to attach die 103 to the top surface of upper contact level 109. Package 101 also includes a second adhesive bleed control ring 137 for containing the adhesive used to attached die 105 to the bottom surface of upper contact level 109. In other embodiments, the die may be attached to upper contact level 109 by using a type of die attach adhesive film or by attaching the die to another type of intervening structure attached to the upper contact level.

In some embodiments, distance from the top surface of die 103 to the bottom surface of die 105 is greater than 0.5 mm so as to reduce inference from the integrated circuits of each die. Placing the die on opposite sides of a frame with two contact levels may allow for an increased distance between the active surfaces (in the embodiment of FIG. 1, the surfaces of the die with the die bond pads) of the top die 103 and the bottom die 105 without significantly increasing the height of the package.

Figure 2:
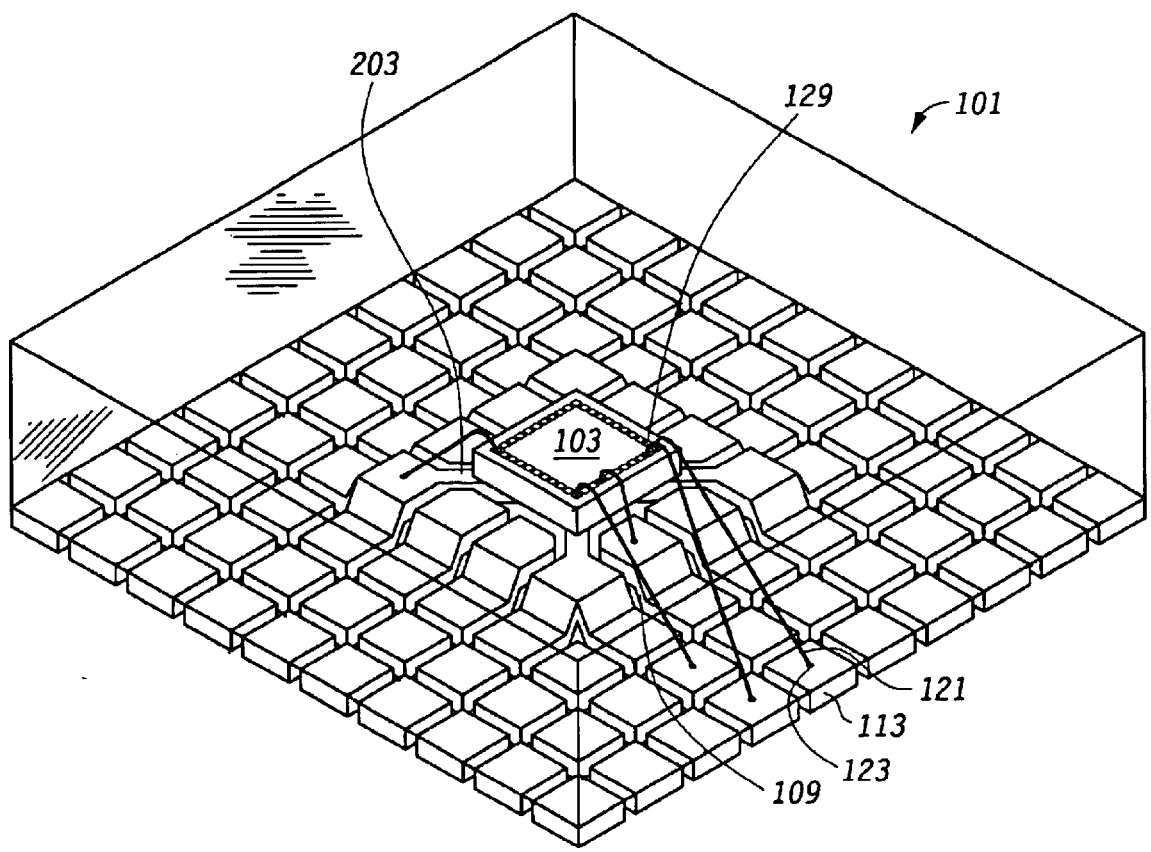
FIG. 2 is a perspective view of one embodiment of a multi-die semiconductor package showing a top integrated circuit die and an electrical interconnect frame according to the present invention.

FIG. 2 shows a perspective view of package 101 with the outer lines of package 101 shown in phantom so as to show the details of frame 107 as well as to show where die 103 is attached to frame 107. Upper contact level 109 includes an X-flag 203 with die 103 being attached to the X-flag. In the embodiment shown, the ground die pads of die 103 and 105 are coupled to X-flag 203. In other embodiments, upper contact level may have other configurations and/or structures to which the die are attached such as, e.g., solid flags.

As shown in FIG. 2, the pads (e.g. 113) on the outer two rows of the perimeter of lower contact level 111 are electrically isolated from the other pads of those rows. In other embodiments, some of the pads of those rows may be electrically coupled to other pads of those rows. Wire 121 is shown bonded to a die bond pad 129 on the top surface of die 103 and to the top surface 123 of a pad 113 of the lower contact level 111. Other wires for coupling the die bond pads on the top surface of die 103 to other pads of lower contact level 111 are not shown in FIG. 2 for simplicity.

Figure 3:
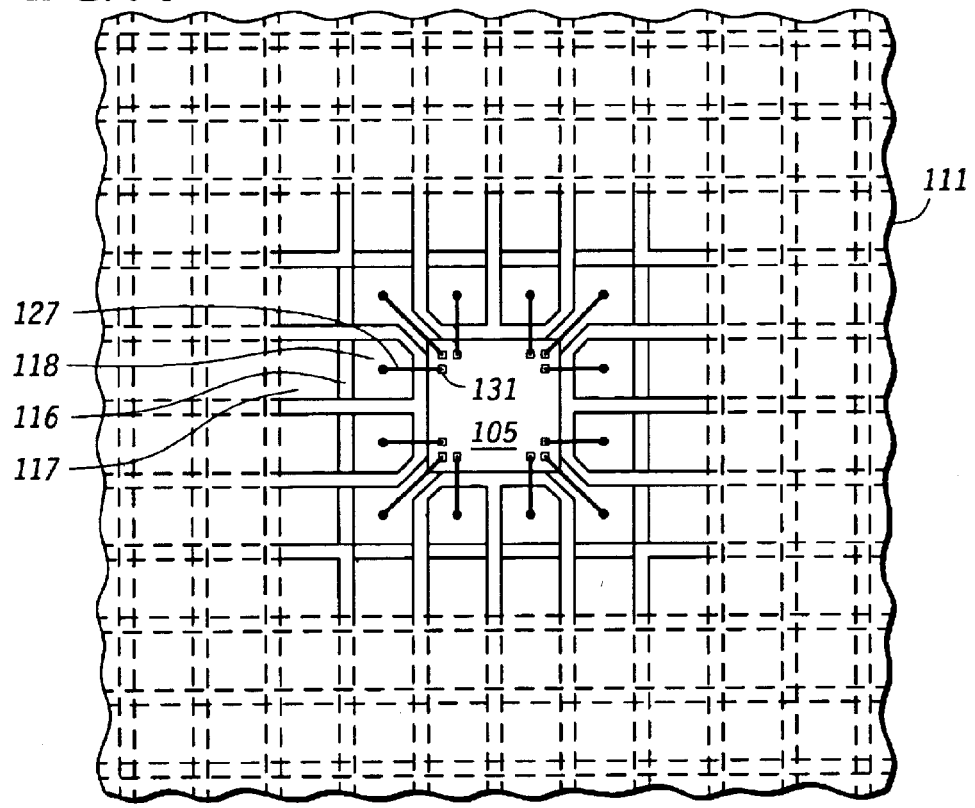
FIG. 3 is a partial bottom view of one embodiment of a sheet from which a multi-die semiconductor package is made according to the present invention.
Figure 4:
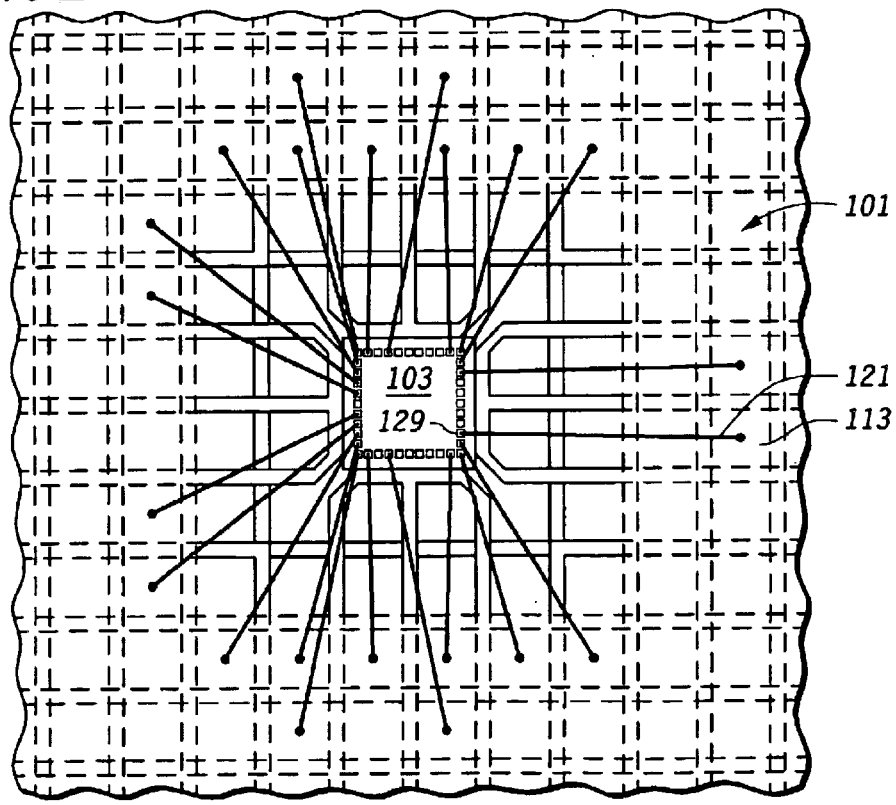
FIG. 4 is a partial top view of one embodiment of a sheet from which a multi-die semiconductor package is made according to the present invention.
Figure 5:
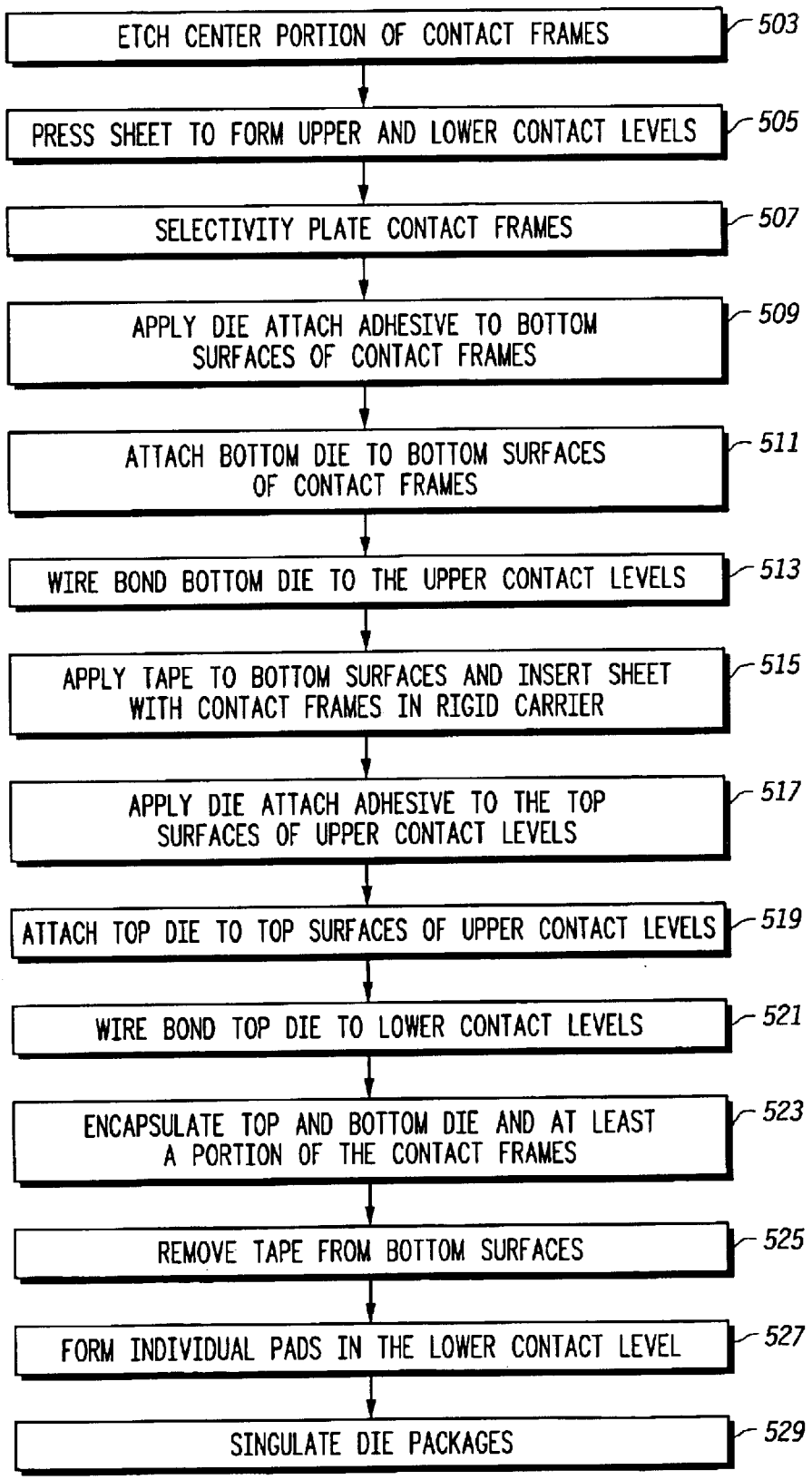
FIG. 5 is a flow diagram setting forth one embodiment of stages for manufacturing a multi-die semiconductor package according to the present invention.

FIG. 5 is a flow diagram setting forth stages for manufacturing a multi-die semiconductor package according to the present invention. FIGS. 3 and 4 each show package 101 at a different stage in the manufacturing process. In the embodiment of FIG. 5, the frames of multiple packages are made from a sheet of metal (not shown). In some embodiments, the sheet is made of copper and has a thickness in the range of 5–10 mills. The process for manufacturing a package may include other conventional stages (e.g. cleaning stages) that are not shown in FIG. 5.

In 503, the sheet of metal is etched at locations corresponding to the center portions of the electrical interconnect frames to define the structures of the upper contact levels (e.g. 109) of each frame. In 505, the sheet is pressed to form the upper contact levels and the lower contact levels. During the pressing operation, portions of the sheet are deformed to provide insert structure (e.g. 116) with an offset between the upper portions (e.g. 118) and the lower portions (e.g. 117). In 507, portions of the frames (e.g. 107) to which a wire is to be bonded are selectively plated with a second metal (e.g. silver, gold, nickel, or palladium). In other embodiments, the entire sheet may be plated.

In 509, an adhesive is applied to the die attach areas of the bottom surfaces of the upper contact levels (e.g. 109) for attaching the bottom dies (e.g. 105) to those die attach areas in 511.

In 513, wires (e.g. 127) are bonded to the die bond pads on the bottom die (e.g. 105) and to the bottom surfaces of the upper portions (e.g. 118) of the inset structures (e.g. 116). In one embodiment, these wires (e.g. 127) are reversed stitch bonded to the bond pads of the bottom die (e.g. 105) and to the upper portions (e.g. 118) of the inset structure (e.g. 116) so as to reduce the loop height of the wires. FIG. 3 is a bottom view showing the portion of the sheet from which package 101 will be made.

In 515, a tape (not shown) is applied across the bottom of the sheet on the bottom side of the lower contact levels (e.g. 111). The tape does not contact the bottom surface of the upper contact levels (e.g. 109), the bottom surface of the bottom die (e.g. 105), or the wires bonded to the bottom die (e.g. 131). The tape provides for a portion of the mold for encapsulation in 523. In some embodiments, a pedestal (not shown) is located between the tape and the top surface of bottom die 105 (the surface of die 105 with the die bond pads, e.g. 131). Also in 515, the sheet is inserted into a ridged carrier (not shown) to support the bottom die (e.g. 105) and to protect the wires (e.g. 127) bonded to the bottom die.

In 517, an adhesive is applied to the die attach areas on the top surfaces of the upper contact levels (e.g. 109) for attaching the top die (e.g. 103) to those die attach areas in 519. In 521, wires (e.g. 121) are bonded to the die bond pads (e.g. 129) of the top die (e.g. 103) and to the top surfaces of the pads (e.g. 113) of the lower contact levels (e.g. 111). In some embodiments, the wires that are bonded to die bond pads of the top die may be bonded to the top surface of the upper portion (e.g. 118) of the inset structures (e.g. 116). FIG. 4 shows a top view, during stage 521, of the portion of the sheet from which package 101 is made. The dashed lines in the lower contact level 111 represents the spaces between the pads that will be removed in stage 527.

In 523, the first and second die and at least a portion of the frames are encapsulated. In 525, the tape is removed from the bottom side of the frames.

In 527, portions of the lower contact layers are removed to form the individual pads (e.g. 113) of the lower contact levels (e.g. 111). Referring to FIG. 4, in one embodiment, the sheet is etched to remove portions of the sheet shown between the dashed lines to form the pads (e.g. 113) of the lower contact levels (e.g. 111). In other embodiments, the material between the pads of the lower contact levels maybe removed by sawing the frames along the dashed lines at a particular depth. In 529, the packages are singulated from each other by e.g. a saw cutting through the encapsulate.

In other embodiments, a die having a flip chip configuration may be attached to the bottom surface of upper contact level. With these embodiments, the solder balls of the die having a flip chip configuration are soldered to the bottom sides of the upper portions (e.g. 118) of the insert structures (e.g. 116). For these embodiments, the upper portions (e.g. 118) of the insert structures (e.g. 116) are extended to be located over die 105, relative to view shown in FIG. 1.

Figure 6:
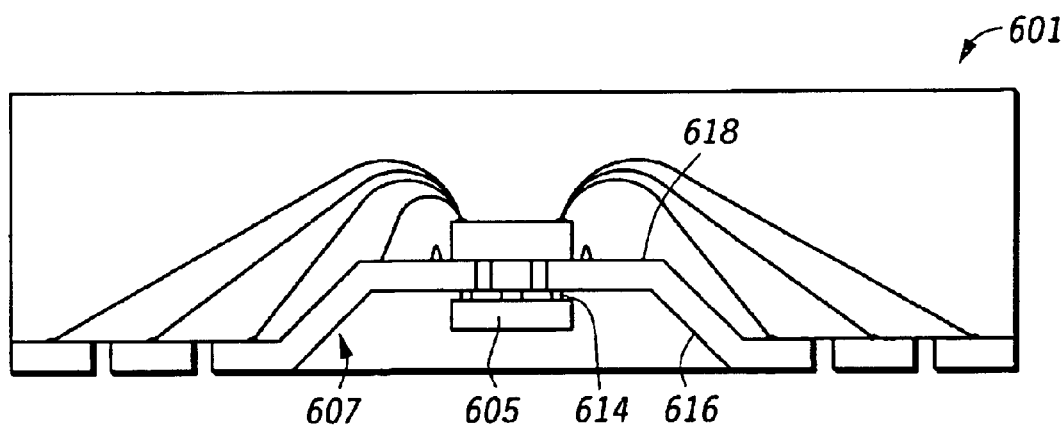
FIG. 6 is a partial side cutaway view of another embodiment of a multi-die semiconductor package according to the present invention.

FIG. 6 is a partial side cutaway view of another embodiment of a multi-die semiconductor package according to the present invention. Package 601 is similar to package 101 except that die 605 has a flip chip configuration. Prior to attachment to frame 607, solder balls are formed on bond pads of die 605. During a soldering process, the solder balls are reflowed (e.g. see reflowed solder 614) to couple the pads to the bottom sides of the upper portions (e.g. 618) of the insert structures (e.g. 616).

In other embodiments, an electrical interconnect frame may have other configurations, and/or the pads of the frame may have other shapes and/or may be arranged in other orientations. For example, the pads of the lower contact level may be diagonally orientated. Also, in other embodiments, frames shown or described herein may be used in other types of packages.

In one aspect of the invention, a semiconductor package includes an electrical interconnect frame having a top electrical contact level and a bottom electrical contact level. The top electrical contact level is substantially parallel to and offset from the bottom electrical contact level. Each of the top and bottom electrical contact levels have both a top surface and a bottom surface. The semiconductor package also includes a first integrated circuit die attached to a top surface of the top electrical contact level and a second integrated circuit die attached to a bottom surface of the top electrical contact level. The semiconductor package also includes a conductor having a first end connected to a pad on the second integrated circuit die and having a second end connected to a bottom surface of a structure of the top electrical contact level. The semiconductor package further includes a first wire having a first end connected to a pad on the first integrated circuit die and having a second end connected to a top surface of a structure of the bottom electrical contact level.

In another aspect of the invention, a semiconductor package includes a metal electrical interconnect frame including a substantially planar top electrical contact level having a first plurality of pads and including a substantially planar bottom electrical contact level having a second plurality of pads. The top electrical contact level is substantially parallel to and offset from the bottom electrical contact level. Both of the top and bottom electrical contact levels have a top surface and a bottom surface. The semiconductor package also includes a first integrated circuit die having a top surface and a bottom surface. The bottom surface of the first integrated circuit die is attached to the top surface of the top electrical contact level. The top surface of the first integrated circuit die has a plurality of pads wire bonded to the second plurality of pads. The semiconductor package also includes a second integrated circuit die having a top surface and a bottom surface. The bottom surface of the second integrated circuit die is attached to a bottom surface of the top electrical contact level. The top surface of the second integrated circuit die has a plurality of pads wire bonded to the first plurality of pads.

In another aspect of the invention, a method for making a semiconductor package includes providing an interconnect frame and etching a predetermined pattern into at least a portion of the interconnect frame. The method also includes forming a top contact level and a bottom contact level in the interconnect frame. The top contact level is offset from and substantially parallel to the bottom contact level. The method also includes attaching a first integrated circuit die to a bottom surface of the top contact level first and electrically coupling the first integrated circuit die to the bottom surface of pads of the top contact level. The method further includes attaching a second integrated circuit die to a top surface of the top contact level and wire bonding the second integrated circuit die to pads of the bottom contact level.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A semiconductor package comprising:
   an electrical interconnect frame having a top electrical contact level and a bottom electrical contact level, the top electrical contact level substantially parallel to and offset from the bottom electrical contact level, each of the top and bottom electrical contact levels having both a top surface and a bottom surface,
   a first integrated circuit die attached to a top surface of the top electrical contact level;
   a second integrated circuit die attached to a bottom surface of the top electrical contact level;
   a conductor having a first end connected to a pad on the second integrated circuit die and having a second end connected to a bottom surface of a structure of the top electrical contact level; and
   a first wire having a first end connected to a pad on the first integrated circuit die and having a second end connected to a top surface of a structure of the bottom electrical contact level.

2. The semiconductor package of claim 1, further comprising a second wire having a first end connected to a second pad on the first integrated circuit die and having a second end connected to a top surface of a structure of the top electrical contact level.

3. The semiconductor package of claim 1, wherein the conductor is characterized as being a wire.

4. The semiconductor package of claim 1, wherein the conductor is characterized as being reflowed solder.

5. The semiconductor package of claim 1, further comprising an adhesive bleed control ring on the top surface of the top electrical contact level for containing an adhesive used to attach the first integrated circuit die to the top surface of the top electrical contact level.

6. The semiconductor package of claim 1, wherein the first integrated circuit die includes digital circuitry and the second integrated circuit die includes analog circuitry.

7. The semiconductor package of claim 1, wherein an active surface of the first integrated circuit die is about to 0.5 millimeter or greater from an active surface of the second integrated circuit die.

8. The semiconductor package of claim 1, wherein the first integrated circuit die is attached to an X-flag of the top electrical contact level.

9. The semiconductor package of claim 1, wherein the first integrated circuit die, the second integrated circuit die, and at least a portion of the electrical interconnect frame are encapsulated with a non electrically conductive encapsulation material.

10. The semiconductor package of claim 9, wherein the bottom electrical contact level includes a plurality of pads that extend from the encapsulation material, the plurality of pads for electrically coupling the semiconductor package to a circuit board.

11. The semiconductor package of claim 10, wherein the plurality of pads are plated with one of gold, silver, nickel, and palladium.

12. The semiconductor package of claim 1 wherein the electrical interconnect frame further comprises an inset structure, the inset structure including a top portion located in the top electrical contact level and a bottom portion located in the bottom electrical contact level, wherein the second end of the conductor is connected to a bottom surface of the top portion.

13. The semiconductor package of claim 12 wherein:
   the first integrated circuit die, the second integrated circuit die, and at least a portion of the electrical interconnect frame are encapsulated with a non electrically conductive encapsulation material; and
   the bottom portion of the inset structure extends from the encapsulation material.

14. The semiconductor package of claim 1 wherein the bottom electrical contact level includes a plurality of pads electrically isolated from each other.

15. A semiconductor package comprising:
   a metal electrical interconnect frame including a substantially planar top electrical contact level having a first plurality of pads and including a substantially planar bottom electrical contact level having a second plurality of pads, the top electrical contact level substantially parallel to and offset from the bottom electrical contact level, both of the top and bottom electrical contact levels having a top surface and a bottom surface;

a first integrated circuit die having a top surface and a bottom surface, the bottom surface of the first integrated circuit die attached to the top surface of the top electrical contact level, the top surface of the first integrated circuit die having a plurality of pads wire bonded to the second plurality of pads; and a second integrated circuit die having a top surface and a bottom surface, the bottom surface of the second integrated circuit die attached to a bottom surface of the top electrical contact level, the top surface of the second integrated circuit die having a plurality of pads wire bonded to the first plurality of pads.

16. The semiconductor package of claim 15, wherein the first integrated circuit die includes digital circuitry and the second integrated circuit die includes analog circuitry.

17. The semiconductor package of claim 15, wherein the top surface of the first integrated circuit die is about 0.5 millimeter or greater from the top surface of the second integrated circuit die.

18. The semiconductor package of claim 15, wherein the first and second plurality of pads are plated with one of gold, silver, nickel, and palladium.

19. The semiconductor package of claim 15, wherein the first integrated circuit die is attach to an X-flag of the top electrical contact level.

20. The semiconductor package of claim 15, wherein the first integrated circuit die, the second integrated circuit die, and at least a portion of the electrical interconnect frame are encapsulated with a non-conducting encapsulation material.

21. The semiconductor package of claim 20, wherein the second plurality of pads extend from the encapsulation material, the second plurality of pads for electrically coupling the semiconductor package to a circuit board.

22. The semiconductor package of claim 15 wherein:
the interconnect frame includes a plurality of inset structures;
each of the first plurality of pads is part of an inset structure of the plurality of inset structures, wherein each of the inset structures includes a bottom portion located in the bottom electrical contact level.

23. The semiconductor package of claim 22 wherein:
the first integrated circuit die, the second integrated circuit die, and at least a portion of the electrical interconnect frame are encapsulated with a non electrically conductive encapsulation material;
the second plurality of pads extend from the encapsulation material, the second plurality of pads for electrically coupling the semiconductor package to a printed circuit board;
the bottom portion of each inset structure of the plurality extends from the encapsulation material, the bottom portion of each inset structure of the plurality for electrically coupling the semiconductor package to a circuit board.

* * * * *